United States Patent
Lee et al.

(10) Patent No.: US 8,853,738 B2
(45) Date of Patent: Oct. 7, 2014

(54) POWER LDMOS DEVICE AND HIGH VOLTAGE DEVICE

(75) Inventors: Chung-Yeh Lee, Hsinchu (TW); Pei-Hsun Wu, Hsinchu (TW); Shiang-Wen Huang, Hsinchu (TW)

(73) Assignee: Episil Technologies Inc., Hsinchu (TW)

( * ) Notice: Subject to any disclaimer, the term of this patent is extended or adjusted under 35 U.S.C. 154(b) by 520 days.

(21) Appl. No.: 13/169,058

(22) Filed: Jun. 27, 2011

(65) Prior Publication Data

US 2012/0261752 A1 Oct. 18, 2012

(30) Foreign Application Priority Data

Apr. 18, 2011 (TW) .............................. 100113398 A

(51) Int. Cl.
*H01L 29/06* (2006.01)
*H01L 29/78* (2006.01)
*H01L 29/10* (2006.01)
*H01L 29/423* (2006.01)

(52) U.S. Cl.
CPC ........ *H01L 29/7816* (2013.01); *H01L 29/0653* (2013.01); *H01L 29/0696* (2013.01); *H01L 29/1095* (2013.01); *H01L 29/0634* (2013.01); *H01L 29/42368* (2013.01)
USPC .................. 257/141; 257/162; 257/E21.373; 257/E21.413

(58) Field of Classification Search
None
See application file for complete search history.

(56) References Cited

U.S. PATENT DOCUMENTS

| 3,967,305 A * | 6/1976 | Zuleeg ............................. 257/8 |
| 5,040,045 A | 8/1991 | McArthur et al. |
| 2005/0179108 A1 | 8/2005 | Hossain et al. |
| 2008/0093641 A1 | 4/2008 | Ludikhuize et al. |
| 2012/0070965 A1 * | 3/2012 | Sasaki ........................... 438/478 |

FOREIGN PATENT DOCUMENTS

| TW | 200529429 | 9/2005 |
| TW | 201025457 | 7/2010 |

OTHER PUBLICATIONS

"Office Action of Taiwan Counterpart Application", issued on Apr. 8, 2014, p. 1-p. 5.

* cited by examiner

*Primary Examiner* — Julio J Maldonado
*Assistant Examiner* — Mohammad Choudhry
(74) *Attorney, Agent, or Firm* — Jianq Chyun IP Office

(57) ABSTRACT

A power LDMOS device including a substrate, source and drain regions, gates and trench insulating structures is provided. The substrate has a finger tip area, a finger body area and a palm area. The source regions are in the substrate in the finger body area and further extend to the finger tip area. The neighboring source regions in the finger tip area are connected. The outmost two source regions further extend to the palm area and are connected. The drain regions are in the substrate in the finger body area and further extend to the palm area. The neighboring drain regions in the palm area are connected. The source and drain regions are disposed alternately. A gate is disposed between the neighboring source and drain regions. The trench insulating structures are in the substrate in the palm area and respectively surround ends of the drain regions.

21 Claims, 5 Drawing Sheets

POWER LDMOS DEVICE AND HIGH VOLTAGE DEVICE

CROSS-REFERENCE TO RELATED APPLICATION

This application claims the priority benefit of Taiwan application serial no. 100113398, filed Apr. 18, 2011. The entirety of the above-mentioned patent application is hereby incorporated by reference herein and made a part of this specification.

BACKGROUND OF THE INVENTION

1. Field of Invention

The present invention relates to a high voltage (>400V) device, and more generally to a power lateral double diffusion MOS (power LDMOS) device having a smaller terminal region.

2. Description of Related Art

As the semiconductor industry is developed with time, a high voltage device such as a power LDMOS device has been widely applied in many electronic systems. Generally speaking, a power LDMOS device includes a plurality of source regions, a plurality of drain regions and a plurality of gates. The source regions and the drain regions are disposed alternately. A gate is disposed between the neighboring source and drain regions. Further, the power LDMOS device has an active region and a terminal region.

The corner portion of the terminal region has the least resistance to high voltage, and the electric filed is too strong thereat. It is known to increase the design rule so as to avoid excessive concentration of electric field. The vertical distance from ends of the drain regions in the terminal region to the periphery of the source region in the terminal region can be enlarged to at least greater than 80 µm. However, this method would waste a significant amount of area and reduce the competitiveness.

SUMMARY OF THE INVENTION

Accordingly, the present invention provides a high voltage device (e.g. a power LDMOS device) to effectively reduce the area of the terminal region of the device and further enhance the degree of integration of the same.

The present invention provides a power LDMOS device including a substrate, a plurality of source regions each having a stripe shape, a plurality of drain regions each having a stripe shape, a plurality of gates and a plurality of first trench insulating structures. The substrate has a finger tip area, a finger body area and a palm area. The source regions are disposed in the substrate in the finger body area and further extend into the substrate in the finger tip area and in the palm area. The neighboring source regions in the finger tip area are connected to each other. The outmost two source regions in the palm area are connected to each other. The drain regions are disposed in the substrate in the finger body area and further extend into the substrate in the finger tip area and in the palm area. The neighboring drain regions in the palm area are connected to each other. The source regions and the drain regions are disposed alternately. The gates are disposed on the substrate in the finger body area, wherein a gate is disposed between a source region and a drain region neighboring to the source region. The first trench insulating structures are disposed in the substrate in the finger tip area and respectively surround ends of the drain regions.

According to an embodiment of the present invention, each of the first trench insulating structures has an arc shape.

According to an embodiment of the present invention, a material of the first trench insulating structures includes silicon oxide, silicon nitride, polysilicon or a combination thereof.

According to an embodiment of the present invention, the power LDMOS device further includes a plurality of second trench insulating structures disposed in the substrate in the finger tip area and each located between the end of a drain region and a first trench insulating structure.

According to an embodiment of the present invention, the second trench insulating structures and the first trench insulating structures have the same shape and the same material.

According to an embodiment of the present invention, the power LDMOS device further includes a plurality of third trench insulating structures disposed in the substrate in the palm area and respectively surrounding ends of the source regions.

According to an embodiment of the present invention, each of the third trench insulating structures has an arc shape.

According to an embodiment of the present invention, a material of the third trench insulating structures includes silicon oxide, silicon nitride, polysilicon or a combination thereof.

According to an embodiment of the present invention, the power LDMOS device further includes a plurality of fourth trench insulating structures disposed in the substrate in the palm area and each located between the end of a source region and a third trench insulating structure.

According to an embodiment of the present invention, the fourth trench insulating structures and the third trench insulating structures have the same shape and the same material.

According to an embodiment of the present invention, the power LDMOS device further includes a plurality of fifth trench insulating structures disposed in the substrate in the palm area and each located around a corner of a source region.

According to an embodiment of the present invention, each of the fifth trench insulating structures has an arc shape.

According to an embodiment of the present invention, a material of the fifth trench insulating structures includes silicon oxide, silicon nitride, polysilicon or a combination thereof.

The present invention further provides a high voltage device including a substrate, a plurality of source regions each having a stripe shape, a plurality of drain regions each having a stripe shape, a plurality of gates and a plurality of first trench insulating structures. The substrate has an active region and a terminal region. The source regions are disposed in the substrate in the active region, wherein ends of the source regions further extend into the substrate in the terminal region. The drain regions are disposed in the substrate in the active region, wherein ends of the drain regions further extend into the substrate in the terminal region. The source regions and the drain regions are disposed alternately. The gates are disposed on the substrate in the active region, wherein a gate is disposed between a source region and a drain region neighboring to the source region. The first trench insulating structures are disposed in the substrate in the terminal region and respectively surround ends of the drain regions, ends of the source regions or ends of the source and drain regions.

According to an embodiment of the present invention, each of the first trench insulating structures has an arc shape.

According to an embodiment of the present invention, a material of the first trench insulating structures includes silicon oxide, silicon nitride, polysilicon or a combination thereof.

According to an embodiment of the present invention, the high voltage device further includes a plurality of second trench insulating structures disposed in the substrate in the terminal region and each located between the end of a drain region or the end of a source region and a first trench insulating structure.

According to an embodiment of the present invention, the second trench insulating structures and the first trench insulating structures have the same shape and the same material.

According to an embodiment of the present invention, the high voltage device further includes a plurality of third trench insulating structures disposed in the substrate in the terminal region and each located around a corner of a source region.

According to an embodiment of the present invention, each of the third trench insulating structures has an arc shape.

According to an embodiment of the present invention, a material of the third trench insulating structures includes silicon oxide, silicon nitride, polysilicon or a combination thereof.

In view of the above, in a high voltage device (e.g. a power LDMOS device), excessive electric field around ends or corner portions can be effectively lessened by disposing at least one trench insulating structure in the terminal region. Further, in the terminal region of the present invention, the vertical distance from the ends of the drain regions to the periphery of the source region in the terminal region can be reduced from more than 80 μm to 0-50 μm. Accordingly, the design rule for the terminal region can be effectively reduced, the area of the terminal region of the device can be decreased, and the degree of integration of the device can be further enhanced.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
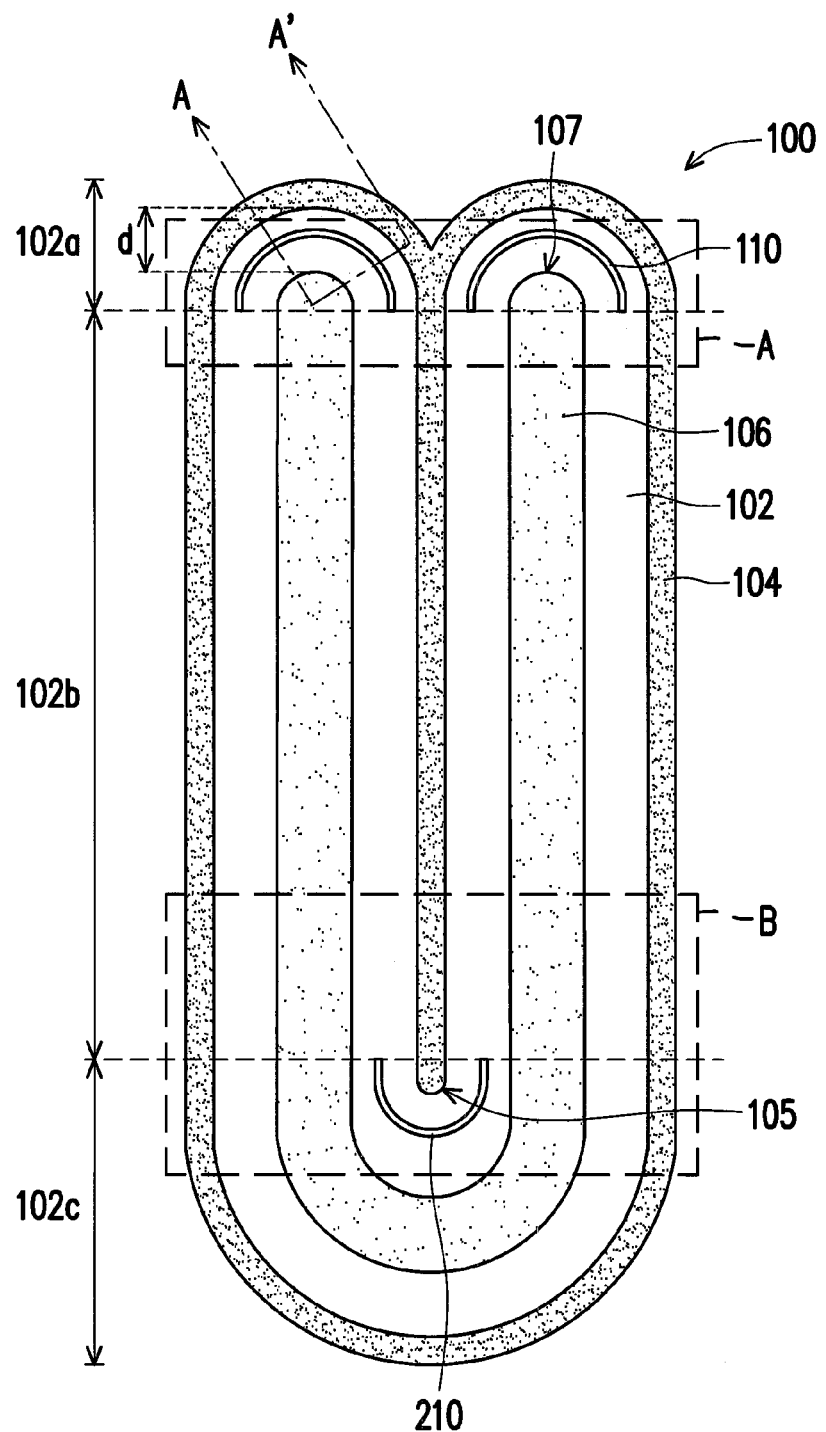
FIG. 1 schematically illustrates a top view of a power LDMOS device according to a first embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

First Embodiment

Figure 1A:
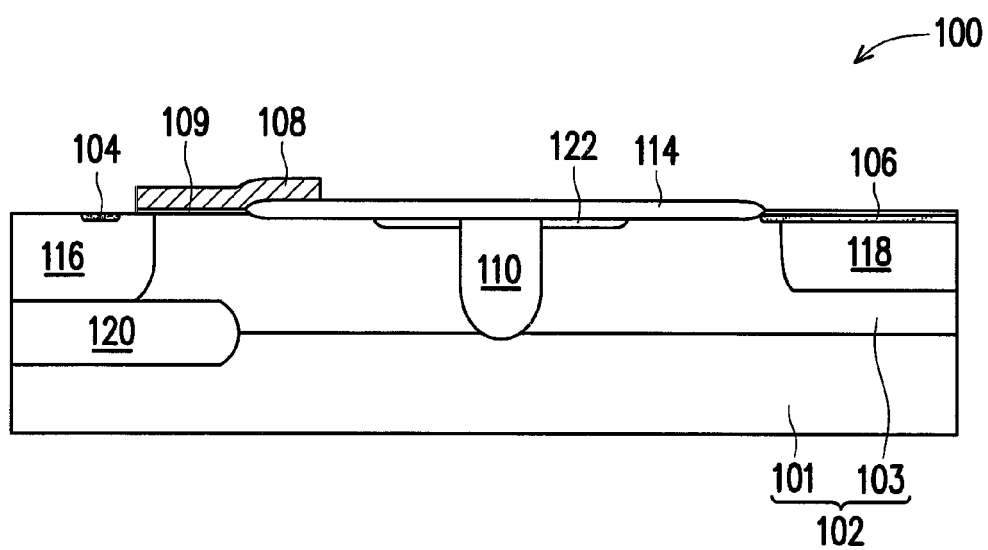
FIG. 1A schematically illustrates a cross-sectional view taken along the line A-A' in FIG. 1.

FIG. 1 schematically illustrates a top view of a power LDMOS device according to a first embodiment of the present invention. FIG. 1A schematically illustrates a cross-sectional view taken along the line A-A' in FIG. 1. For clarity and convenience of illustration, only source regions, drain regions and trench insulating structures are shown in FIG. 1.

Referring to FIGS. 1 and 1A, a power LDMOS device 100 of the first embodiment includes a substrate 102, a plurality of source regions 104 each having a stripe shape, a plurality of drain regions 106 each having a stripe shape, a plurality of gates 108, a plurality of trench insulating structures 110 and a plurality of trench insulating structures 210.

The substrate 102 includes a wafer substrate layer 101 and an epitaxial layer 103 disposed on the wafer substrate layer 101. The wafer substrate layer 101 is a P-type layer, and the epitaxial layer 103 is an N-type epitaxial layer, for example. The substrate 102 has a finger tip area 102a, a finger body area 102b and a palm area 102c. In terms of functionality, the finger tip area 102a serves as a drain center, the finger body area 102b serves as an active region, and the palm area 102c serves as a source center. In terms of design layout, the finger body area 102b is referred to as a planar region, and the finger tip area 102a and the palm area 102c are referred to as a cylindrical region or a terminal region.

The source regions 104 are N-type heavily doped regions, for example. The source regions 104 are disposed in the substrate 102 in the finger body area 102b and further extend into the substrate 102 in the finger tip area 102a and the palm area 102c. Specifically, the source regions 104 are disposed in the epitaxial layer 103 of the substrate 102. The neighboring source regions 104 in the finger tip area 102a are connected to each other. The outmost two source regions 104 in the palm area 102c are connected to each other.

The drain regions 106 are N-type heavily doped regions, for example. The drain regions 106 are disposed in the substrate 102 in the finger body area 102b and further extend into the substrate 102 in the finger tip area 102a and the palm area 102c. Specifically, the source regions 106 are disposed in the epitaxial layer 103 of the substrate 102. Further, ends 107 of the drain regions 106 further extend into the substrate 102 in the finger tip area 102a. The neighboring drain regions 106 in the palm area 102c are connected to each other. The source regions 104 and the drain regions 106 are disposed alternately.

The gates 108 are disposed on the substrate 102 in the finger body area 102b, and a gate 108 is disposed between a source region 104 and a drain region 106 neighboring to the source region 104. A material of the gates 108 is doped polysilicon, for example. In an embodiment, a gate oxide layer 109 is further disposed between each gate 108 and the substrate 102.

The trench insulating structures 110 are disposed in the substrate 102 in the finger tip area 102a. Specifically, the trench insulating structures 110 are disposed in the epitaxial layer 103 and in a portion of the wafer substrate layer 101. In this embodiment, each of the trench insulating structures 110 has an arc shape, and the trench insulating structures 110 respectively surround the ends 107 of the drain regions 106 in the finger tip area 102a. Further, in consideration of the process window, the trench insulating structures 110 can further extend into the substrate 102 in the finger body area 102b (not shown). A material of the trench insulating structures 110 is silicon oxide, silicon nitride, polysilicon or a combination thereof, for example. In an embodiment, silicon oxide is filled in the trench insulating structures 110. In another embodiment, thermal oxide is grown in the trench insulating structures 110, followed by filling of polysilicon therein.

The trench insulating structures 210 are disposed in the substrate 102 in the palm area 102c. Specifically, the trench insulating structures 210 are disposed in the epitaxial layer 103 and in a portion of the wafer substrate layer 101. In this embodiment, each of the trench insulating structures 210 has an arc shape, and the trench insulating structures 210 respectively surround ends 105 of the source regions 104 in the palm area 102c. Further, in consideration of the process window, the trench insulating structures 210 can further extend into the substrate 102 in the finger body area 102b (not shown). A material of the trench insulating structures 210 is silicon oxide, silicon nitride, polysilicon or a combination thereof, for example. The material of the trench insulating structures 210 can be the same or different from that of the trench insulating layers 110.

Besides, the shapes of the trench insulating structures 110 and the trench insulating structures 210 are not limited by the present invention. It is appreciated by persons skilled in the art that each of the trench insulating structures 110 (or the trench insulating structures 210) can has a U-shape, a V-shape, a hoof shape or any shape, as long as electric field concentration around the ends 105 of the source regions 104 or the ends 107 of the drain regions 106 can be effectively reduced.

Moreover, the power LDMOS device 100 of the first embodiment can further include other components known to persons skilled in the art, such as at least one isolation structure 114, at least one well region 116, at least one well region 118, at least one buried layer 120, at least one doped region 122 etc., as shown in FIG. 1A.

The isolation structure 114 is disposed on the substrate 102 between the source region 104 and the drain region 106. The gate 108 further extends to above a portion of the isolation structure 114. The isolation structure 114 includes a field oxide (FOX) structure or a shallow trench isolation (STI) structure.

The well region 116 is a P-type well region, for example. The well region 116 is disposed in the epitaxial layer 103 of the substrate 102. The source region 104 is disposed in the well region 116. The well region 116 further extends into the substrate 102 below the gate 108.

The well region 118 is an N-type well region, for example. The well region 118 is disposed in the epitaxial layer 103 of the substrate 102. The drain region 106 is disposed in the well region 118. The well region 118 can overlap with the isolation structure 114 or not.

The buried layer 120 is a P-type buried layer, for example. The buried layer 120 is disposed at the interface between the wafer substrate layer 101 and the epitaxial layer 103 of the substrate 102 and is connected to the well region 116.

The doped region 122 is a P-type lightly doped region, for example. The doped region 122 is disposed in the epitaxial layer 103 of the substrate 102 below the isolation structure 114.

In the first embodiment, the trench isolation structures 110 respectively surround the ends 107 of the drain regions 106 in the finger tip area 102a, so that the vertical distance d from the ends 107 of the drain regions 106 in the finger tip area 102a to the periphery of the source region 104 in the finger tip area 102a can be reduced to less than 80 μm, and electric field concentration does not occur. Specifically, the vertical distance d is between 0 μm and 50 μm.

Figure 2:
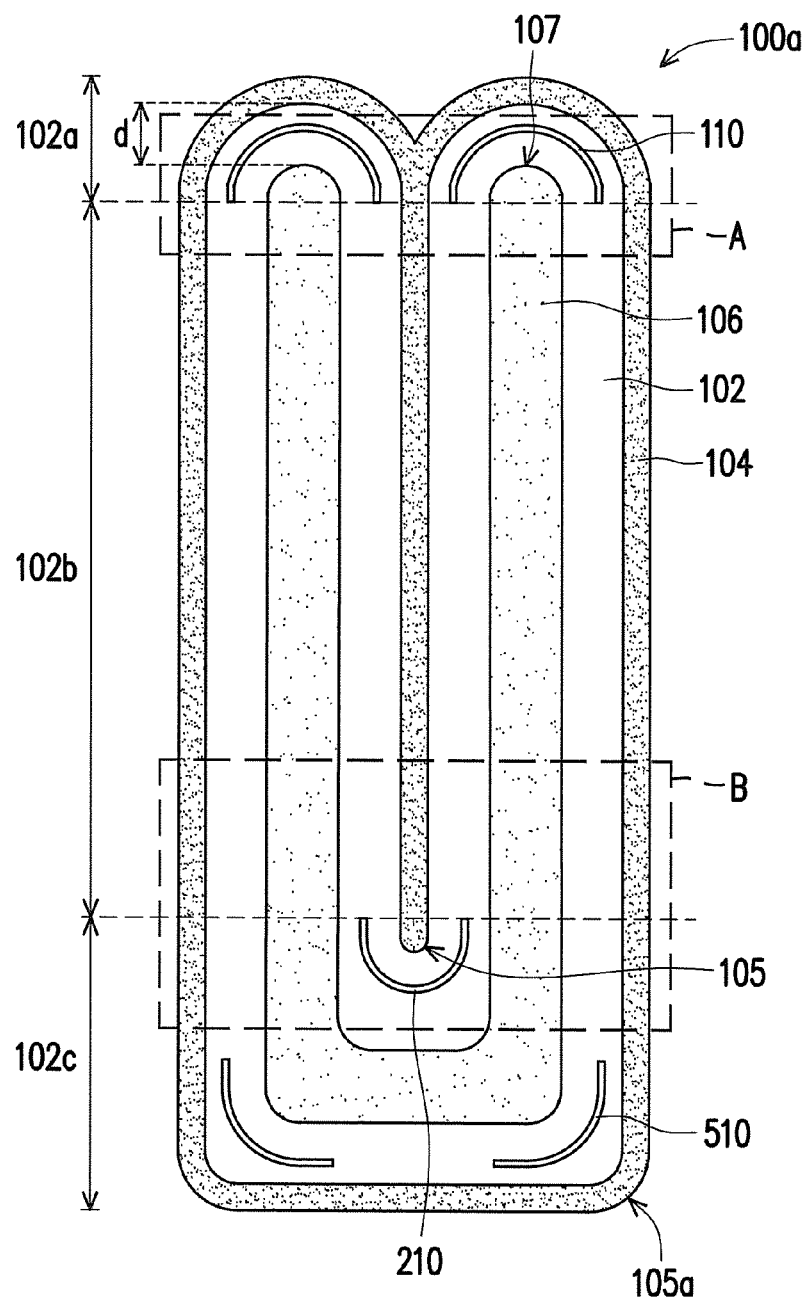
FIG. 2 schematically illustrates a top view of a power LDMOS device according to an embodiment of the present invention.

Further, in the above-mentioned embodiment, the corner of the source regions 104 in the palm area 102c has a semicircle shape, so that electric field concentration does not occur thereat. However, when the angle of the corner of the source regions 104 in the palm area 102c is close to a right angle, the electric field concentration may be observed around the corner. In an embodiment, trench insulating structures 510 can be further disposed in the substrate 102 in the palm area 102c and each of the trench insulating structures 510 is located around the corner 105 of a source region 104 to prevent an electric field concentration phenomenon, as shown in FIG. 2. The trench insulating structures 510 each have an arc shape and the material thereof is silicon oxide, silicon nitride, polysilicon or a combination thereof, for example.

Based on the same logic, when the electric field concentration occurs around ends or corners of the source regions 104 and the drain regions 106, the trench insulating structures of the present invention can be disposed at these positions to effectively resolve the problem of electric field concentration.

Second Embodiment

Figure 3:
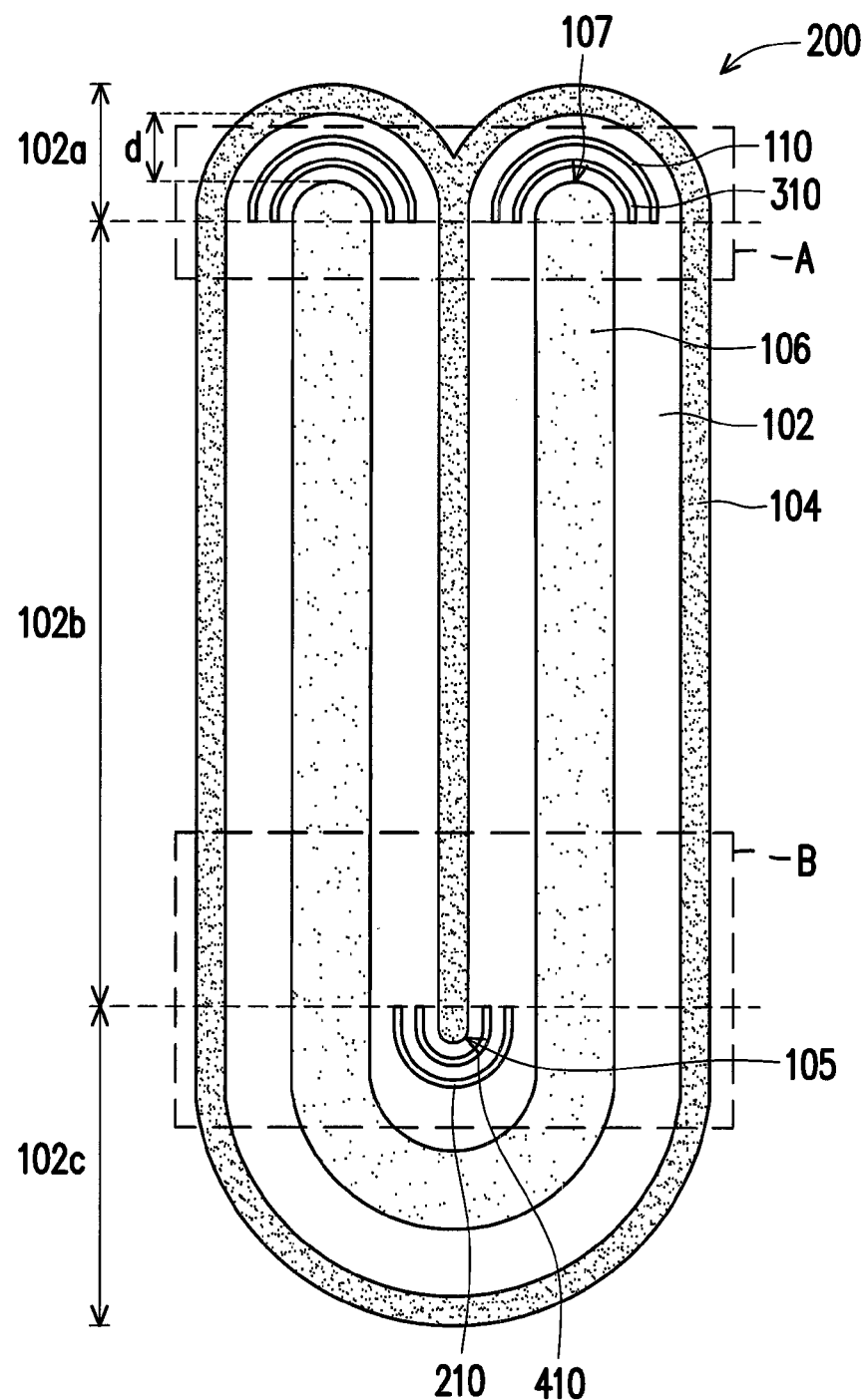
FIG. 3 schematically illustrates a top view of a power LDMOS device according to a second embodiment of the present invention.

FIG. 3 schematically illustrates a top view of a power LDMOS device according to a second embodiment of the present invention. For clarity and convenience of illustration, only source regions, drain regions and trench insulating structures are shown in FIG. 3. The power LDMOS device of the second embodiment is similar to that of the first embodiment. The differences between them are described in the following, and the same parts are not iterated therein.

Referring to FIG. 3, a power LDMOS device 200 of the second embodiment includes a substrate 102, a plurality of source regions 104 each having a stripe shape, a plurality of drain regions 106 each having a stripe shape, a plurality of gates 108, a plurality of trench insulating structures 110, a plurality of trench insulating structures 210, a plurality of trench insulating structures 310 and a plurality of trench insulating structures 410.

The trench insulating structures 110 are disposed in the substrate 102 in the finger tip area 102a and respectively surround the ends 107 of the drain regions 106 in the finger tip area 102a.

The trench insulating structures 210 are disposed in the substrate 102 in the palm area 102c and respectively surround the ends 105 of the source regions 104 in the palm area 102c.

The trench insulating structures 310 are disposed in the substrate 102 in the finger tip area 102a, and each of the trench insulating structures 310 is located between the end 107 of a drain region 106 and the trench insulating structure 110. The trench insulating structures 310 and the trench insulating structures 110 can have the same material and the same shape. In an embodiment, the trench insulating structures 310 can further extend into the substrate 102 in the finger body area 102b (not shown).

The trench insulating structures 410 are disposed in the substrate 102 in the palm area 102c, and each of the trench insulating structures 410 is located between the end 105 of a source region 104 and the trench insulating structure 210. The trench insulating structures 410 and the trench insulating structures 210 can have the same material and the same shape. In an embodiment, the trench insulating structures 410 can further extend into the substrate 102 in the finger body area 102b (not shown).

In the second embodiment, the trench isolation structures 110 and the trench isolation structures 310 surround the ends 107 of the drain regions 106 in the finger tip area 102a, so that the vertical distance d from the ends 107 of the drain regions 106 in the finger tip area 102a to the periphery of the source region 104 in the finger tip area 102a can be reduced to less than 80 μm, and electric field concentration does not occur. Specifically, the vertical distance d is between 0 μm and 50 μm.

Figure 4:
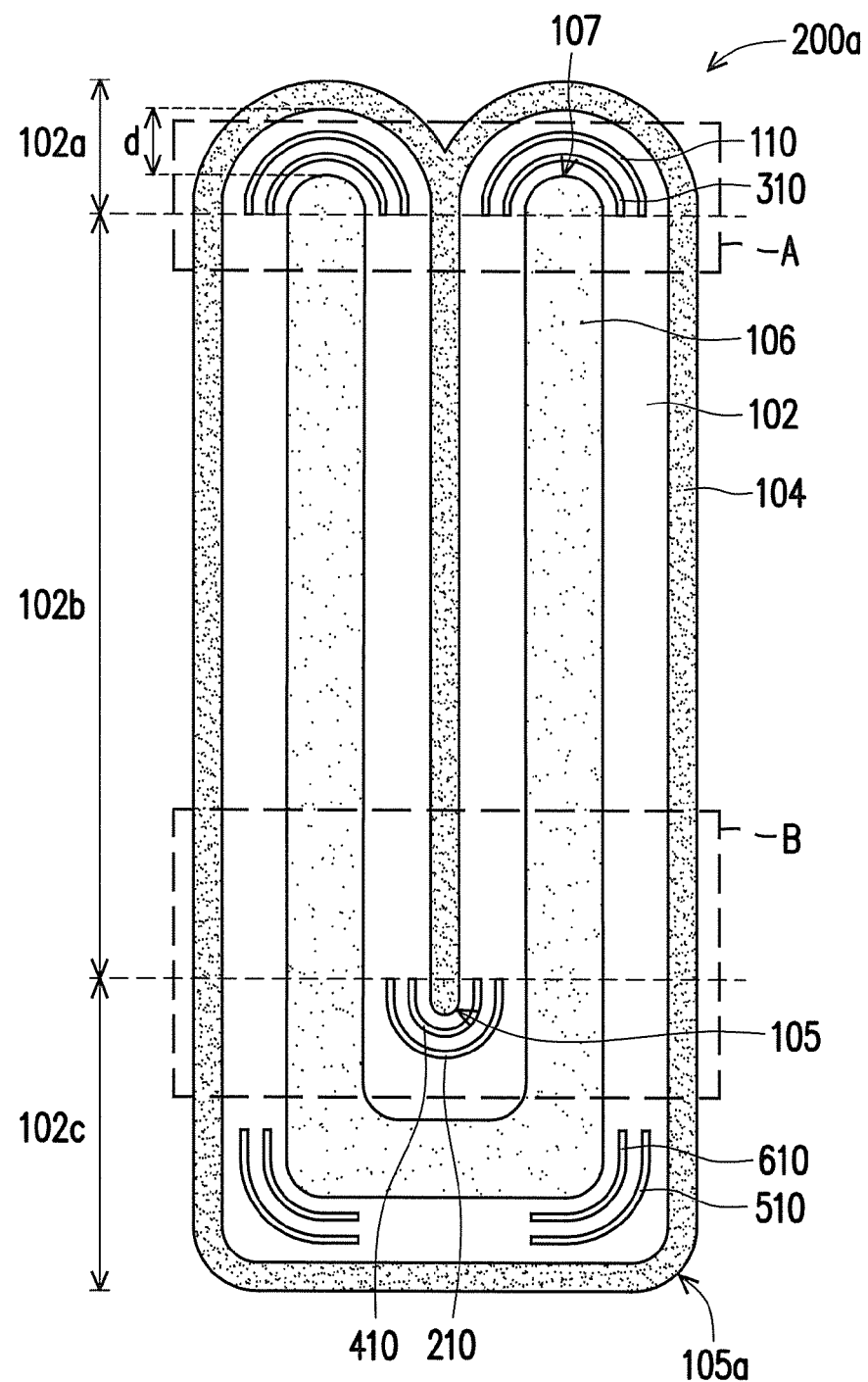
FIG. 4 schematically illustrates a top view of a power LDMOS device according to an embodiment of the present invention.

In an embodiment, as shown in FIG. 4, when the angle of the corner 105a of the source regions 104 in the palm area 102c is close to a right angle, trench insulating structures 510 and trench insulating structures 610 can be further disposed in the substrate 102 in the palm area 102c and located around the corners 105a of the source regions 104 to prevent an electric field concentration phenomenon.

The above-mentioned embodiments in which the power LDMOS device has two fingers are provided for illustration purposes and are not construed as limiting the present invention. It is appreciated by persons skilled in the art that the power LDMOS device of the present invention can have three fingers, five fingers or multiple fingers upon the process requirements, so as to increase the resistance to high voltage.

Besides, in the above-mentioned embodiments, one or two trench insulating structures are disposed around each end or corner of the source regions 104 and the drain regions 106. However, the present invention is not limited thereto. It is for sure that more than two trench insulating structures can be disposed at each of these positions (e.g. ends or corners) upon the process design, so as to effectively resolve the problem of electric field concentration.

In addition, it is noted that the present invention can be applied to not only the power LDMOS device but also other high voltage devices. For example, a region A or B including the partial active region and the partial terminal region can be applied to a high voltage device so as to resolve the problem of electric field concentration in the same manner. Specifically, the region A includes a portion of the finger tip area 102a and a portion of the finger body area 102b, and the region B includes a portion of the palm area 102c and a portion of the finger body area 102b.

In summary, in a high voltage device (e.g. a power LDMOS device), excessive electric field around ends or corners can be effectively lessened by disposing at least one trench insulating structure in the terminal region. Further, in the terminal region of the present invention, the vertical distance from the ends of the drain regions to the periphery of the source region in the terminal region can be reduced from more than 80 μm to 0-50 μm. Accordingly, the design rule for the terminal region can be effectively reduced, the area of the terminal region of the device can be decreased, and the degree of integration of the device can be further enhanced.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A power LDMOS device, comprising:
a substrate, having a finger tip area, a finger body area and a palm area;
a plurality of source regions each having a stripe shape, disposed in the substrate in the finger body area and further extending into the substrate in the finger tip area and in the palm area, wherein neighboring source regions in the finger tip area are connected to each other, and outmost two source regions in the palm area are connected to each other;
a plurality of drain regions each having a stripe shape, disposed in the substrate in the finger body area and further extending into the substrate in the finger tip area and in the palm area, wherein neighboring drain regions in the palm area are connected to each other, and the source regions and the drain regions are disposed alternately;
a plurality of gates, disposed on the substrate in the finger body area, wherein a gate is disposed between a source region and a drain region neighboring to the source region; and
a plurality of first trench insulating structures, disposed in the substrate in the finger tip area and respectively surrounding ends of the drain regions.

2. The power LDMOS device of claim 1, wherein each of the first trench insulating structures has an arc shape.

3. The power LDMOS device of claim 1, wherein a material of the first trench insulating structures comprises silicon oxide, silicon nitride, polysilicon or a combination thereof.

4. The power LDMOS device of claim 1, further comprising a plurality of second trench insulating structures disposed in the substrate in the finger tip area and each located between the end of a drain region and a first trench insulating structure.

5. The power LDMOS device of claim 4, wherein the second trench insulating structures and the first trench insulating structures have the same shape and the same material.

6. The power LDMOS device of claim 1, further comprising a plurality of third trench insulating structures disposed in the substrate in the palm area and respectively surrounding ends of the source regions.

7. The power LDMOS device of claim 6, wherein each of the third trench insulating structures has an arc shape.

8. The power LDMOS device of claim 6, wherein a material of the third trench insulating structures comprises silicon oxide, silicon nitride, polysilicon or a combination thereof.

9. The power LDMOS device of claim 6, further comprising a plurality of fourth trench insulating structures disposed in the substrate in the palm area and each located between the end of a source region and a third trench insulating structure.

10. The power LDMOS device of claim 9, wherein the fourth trench insulating structures and the third trench insulating structures have the same shape and the same material.

11. The power LDMOS device of claim 1, further comprising a plurality of fifth trench insulating structures disposed in the substrate in the palm area and each located around a corner of a source region.

12. The power LDMOS device of claim 11, wherein each of the fifth trench insulating structures has an arc shape.

13. The power LDMOS device of claim 12, wherein a material of the fifth trench insulating structures comprises silicon oxide, silicon nitride, polysilicon or a combination thereof.

14. A high voltage device, comprising:
a substrate, having an active region and a terminal region;
a plurality of source regions each having a stripe shape, disposed in the substrate in the active region, wherein ends of the source regions further extend into the substrate in the terminal region;
a plurality of drain regions each having a stripe shape, disposed in the substrate in the active region, wherein ends of the drain regions further extend into the substrate in the terminal region, and the source regions and the drain regions are disposed alternately;
a plurality of gates, disposed on the substrate in the active region, wherein a gate is disposed between a source region and a drain region neighboring to the source region; and
a plurality of first trench insulating structures, disposed in the substrate in the terminal region and respectively surrounding ends of the drain regions, ends of the source regions or ends of the source and drain regions.

15. The high voltage device of claim 14, wherein each of the first trench insulating structures has an arc shape.

16. The high voltage device of claim 14, wherein a material of the first trench insulating structures comprises silicon oxide, silicon nitride, polysilicon or a combination thereof.

17. The high voltage device of claim 14, further comprising a plurality of second trench insulating structures disposed in the substrate in the terminal region and each located between the end of a drain region or the end of a source region and a first trench insulating structure.

18. The high voltage device of claim 17, wherein the second trench insulating structures and the first trench insulating structures have the same shape and the same material.

19. The high voltage device of claim 14, further comprising a plurality of third trench insulating structures disposed in the substrate in the terminal region and each located around a corner of a source region.

20. The high voltage device of claim 19, wherein each of the third trench insulating structures has an arc shape.

21. The high voltage device of claim 19, wherein a material of the third trench insulating structures comprises silicon oxide, silicon nitride, polysilicon or a combination thereof.

* * * * *